United States Patent
Czech et al.

(10) Patent No.: US 6,620,559 B2
(45) Date of Patent: Sep. 16, 2003

(54) PHOTOMASK, METHOD OF LITHOGRAPHICALLY STRUCTURING A PHOTORESIST LAYER WITH THE PHOTOMASK, AND METHOD OF PRODUCING MAGNETIC MEMORY ELEMENTS

(75) Inventors: Günther Czech, Langebrück (DE); Wolfgang Henke, Dresden (DE); Carsten Fülber, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/967,698

(22) Filed: Sep. 28, 2001

(65) Prior Publication Data

US 2002/0039691 A1 Apr. 4, 2002

(30) Foreign Application Priority Data

Sep. 28, 2000 (DE) .......................... 100 48 151

(51) Int. Cl.[7] .............. G03F 9/00; G03F 7/20
(52) U.S. Cl. .............. 430/5; 430/30; 430/312; 430/320; 430/394; 430/396
(58) Field of Search .............. 430/312, 320, 430/394, 396, 5, 30; 438/3

(56) References Cited

U.S. PATENT DOCUMENTS

| | | | |
|---|---|---|---|
| 5,472,813 A | | 12/1995 | Nakagawa et al. |
| 5,863,677 A | | 1/1999 | Nakao |
| 5,897,975 A | * | 4/1999 | Ahn et al. .............. 430/5 |
| 5,958,656 A | * | 9/1999 | Nakao .............. 430/394 |
| 6,096,457 A | * | 8/2000 | Pierrat .............. 430/5 |
| 6,280,888 B1 | * | 8/2001 | Nakabayashi et al. .......... 430/5 |
| 6,296,991 B1 | * | 10/2001 | Lin .............. 430/322 |
| 6,395,456 B1 | * | 5/2002 | Tamada et al. .............. 430/312 |

FOREIGN PATENT DOCUMENTS

JP  01 283 925 A  11/1989

OTHER PUBLICATIONS

Marc D. Levenson et al.: "Improving Resolution in Photo-lithography with a Phase–Shifting Mask", IEEE Transactions on Electron Devices, vol. ED–29, No. 12, Dec. 1982, pp. 1828–1836.

Marc D. Levenson: "Wavefront Engineering For Photolithography", Physics Today, Jul. 1993, pp. 28–36.

J. Wecker et al.: "Giant magnetoresistance in melt spun Cu–Co alloys", Appl. Phys. Lett., vol. 62, No. 16, Apr. 18, 1993, pp. 1985–1987.

H.A.M. van den Berg et al.: "GMR angle detector with an artificial antiferromagnetic subsystem (AAF)", Journal of Magnetism and Magnetic Materials, No. 165, 1997, pp. 524–528.

T. Brunner et al.: "170 nm gates fabricated by phase–shift mask and top anti–reflector process", SPIE, vol. 1927, Optical/Laser Microlithography VI, 1993, pp. 182–189.

* cited by examiner

Primary Examiner—John A. McPherson
Assistant Examiner—K Sagar
(74) Attorney, Agent, or Firm—Laurence A. Greenberg; Werner H. Stemer; Ralph E. Locher

(57) ABSTRACT

The photomask and the associated method of lithography and mask technique enable production of a regular configuration of resist dots or holes. At least one photomask is a phase mask. The method is useful for the production of magnetic memory components, in particular MRAM memories, having elliptically shaped magnetic memory elements of high density.

10 Claims, 3 Drawing Sheets

PHOTOMASK, METHOD OF LITHOGRAPHICALLY STRUCTURING A PHOTORESIST LAYER WITH THE PHOTOMASK, AND METHOD OF PRODUCING MAGNETIC MEMORY ELEMENTS

BACKGROUND OF THE INVENTION

Field of the Invention

The invention relates in general to photomasks for lithographic exposure and structuring methods with the aim of producing microscopic material structures such as photoresist structures and, on this basis, of producing microscopic material structures such as magnetic memory element configurations or the like. In particular, the invention relates in this case to phase masks and their utilization in these methods and the production of dimensionally critical material structures.

For the production of the memory level (XMR level) of magnetic memory components such as magnetic RAM data memories (MRAM), as described for example in S. Mengel: Technologieanalyse Magnetismus Band 2, XMR-Technologien [Technological analysis, magnetism volume 2, XMR technologies], published by VDI-Technologiezentrum Physikalische Technologien, 1997, it is a general object to produce the individual magnetic memory elements in increasing densities, in order to increase the storage capacity of the entire memory component. Hitherto, such structures have been produced either electron-optically by means of a direct writing method or by means of conventional optical lithography, corresponding to the conventional methods for producing microelectronic circuits.

In photolithographic processes, the structures are projected optically onto light-sensitive layers such as photoresist layers on a substrate in a conventional manner by photomasks. Because of the diffraction effects, the resolution power of such a projection system is limited and mask structures having dimensions below the inverse value of this resolution capacity, the dimensionally critical structures as they are known, become blurred or projected unsharply. In order to be able to produce magnetic memory elements with high density, it is previously necessary for a photoresist layer in the form of a matrix-like configuration of resist clusters or dots or of cutouts or depressions in a resist layer to be structured. Using conventional lithography, however, it is very difficult to reach below the resolution limit which is normally given, wherein half the distance between two resist dots is given by $k_{1\lambda}/NA$ with ($k_1 \approx 0.38$, $\lambda$ the carrier wavelength of the illumination, NA the numerical aperture). At the least, such dense resist dots cannot be produced with a non-negligible process margin in the conventional optical way. Furthermore, the conventional optical projection is very sensitive to fluctuations in the mask dimensions which, for example, can be described by the "mask error enhancement factor" (MEF).

The above problems constitute limiting factors for the cost-effective and competitive fabrication of MRAM memory components with critical dimensions below 100 nm with conventional lithography and mask technique.

These difficulties may be overcome with phase masks, as they are known. In phase masks, the destructive interference effect of two closely adjacent and coherent light beams with phases shifted by 180° is utilized.

The various types of phase masks are described, for example, in the book "Technologie hochintegrierter Schaltungen" [The technology of highly integrated circuits] by Widmann, Mader, and Friedrich, 2nd edition, Springer-Verlag, pages 135ff. An extensive overview of phase mask technology is given in the publications "Improving Resolution in Photolithography with a Phase-Shifting Mask" by M. D. Levenson et al. in IEEE Trans. Electron. Devices 29 (1982), 1828ff. and "Wavefront Engineering for Photolithography" by M. D. Levenson in Physics Today, July 1993, p. 28ff.

In the case of MRAM memory components, it is additionally advantageous to produce the individual magnetic memory elements as elliptically shaped structures of high density, since they thus impart a preferred direction to the magnetic storage medium. This has been shown in the publications "Giant magnetoresistance by melt-spun CU—CO alloys" by J. Wecker et al. in Appl. Phys. Lett. 62 (1993), pp. 1985–1987, and "GMR angle detector with an artificial antiferromagnetic subsystem (AAF)" in J. Magn. Mat. 165 (1997) p. 524, using magneto-resistance elements.

Conventional optical lithography is also problematic under this last-named aspect. This is the case because using the conventional binary chromium photomasks, defined production of elliptical structures, that is to say both depressions (holes) in resist layers and resist dots, can generally not be carried out. In the case of dense structures, the necessary reserve on the mask structures would, under certain circumstances, be too great for practical mask production.

SUMMARY OF THE INVENTION

It is accordingly an object of the invention to provide a method for lithographic structuring of a material layer, in particular a photoresist layer, which overcomes the above-mentioned disadvantages of the heretofore-known devices and methods of this general type and which allows microscopic, in particular elliptical material structures to be produced. In particular, it is an object of the present invention to specify a suitable photomask and its use for implementing such a method. Furthermore, it is an object of the present invention to provide a method on this basis of producing a magnetic memory component such as an MRAM memory component with the aid of the structuring method.

With the foregoing and other objects in view there is provided, in accordance with the invention, a photomask for lithographic structuring methods, comprising:

a configuration of at least partially transparent strip-like areas arranged immediately adjacent and parallel to one another; and wherein adjacent areas are formed such that rays of light passing therethrough have a phase difference of 180° relative to one another.

With the above objects in view there is also provided, in accordance with the invention, a lithographic structuring method which comprises providing a material layer, in particular a photoresist layer, and exposing the material layer through the above-summarized photomask.

Finally, there is also provided a method of producing a matrix-like configuration of magnetic memory elements, which comprises:

producing a matrix-like arrangement of microscopic photoresist structures in accordance with the above method; and subsequently producing the matrix-like configuration of magnetic memory elements with the aid of the arrangement of microscopic photoresist structures.

A significant idea of the invention consists in using at least one photomask, which is formed as a phase mask, in the exposures of a material layer to be structured, in particular a photoresist layer. Such a photomask has an arrangement of at least partially transparent strip-like areas, which are arranged immediately adjacent and parallel to one another, adjacent areas being formed in such a way that rays of light passing through them have a phase difference of 180° from one another.

Using such a photomask, a first exposure can be carried out, narrow strip-like sections remaining unexposed on the surface of the material layer to be exposed, because of the destructive interference of the rays of light passing through adjacent areas, said sections being defined by the boundaries between the adjacent areas.

A second exposure can then be carried out, wherein, for example, a second corresponding photomask is used, the alignment of the strip-like arrangement of the photomasks being rotated through an angle, in particular 90°, between the exposures. At the crossing points of the strip-like arrangements, hole-like or cluster-like resist structures are formed, so that the result produced is a matrix-like arrangement of such resist structures.

The novel method has the advantage that hole-like or cluster-like material structures such as resist structures can be produced, their extent, at least in one direction, falling below critical dimensions. For example, the case may occur wherein structures are required which have to be subcritical only in one direction but in the other direction have an extent above the critical dimensions. With respect to the last-named direction, it is possible for example for a conventional, binary chromium photomask to be used, which has an arrangement of strips of chromium running in this direction, their width corresponding to the structure width desired in this direction. In this way, for example, elliptical structures can be produced wherein the minor axis of the ellipse is dimensionally critical but the major axis is not.

Likewise, it may be desired for the resist structures to be produced to be dimensionally critical in both directions. In this case, in practical terms, a single phase mask can be used and, after a first exposure step has been carried out, can be rotated through a predetermined angle, a second exposure step then being carried out. In this case, both exposure steps can be carried out identically, so that in the ideal case circular cluster-like or hole-like resist structures with dimensionally critical extents are produced. However, even for this case, it may be desired for elliptical structures to be produced which are dimensionally critical in both directions. This can then be achieved by choosing different exposure doses and/or different filling factors ($\sigma$ or NA) for the various exposures and/or deliberately causing a projection error such as coma or astigmatism during at least one exposure and/or by introducing an oblique course of the phase boundary on one of the phase masks used during the exposures.

In the case where phase masks are used, chromium-free phase masks are preferably used. With these, in principle the smallest values for k1 can be produced optically during the lithographic projection of dense structures, as has been shown in the publication "170 nm gates fabricated by phase-shift mask and top anti-reflector process" by T. Brunner et al. in Proc. SPIE, Vol. 1927 (1993), pp. 182–189, which is hereby incorporated into the disclosure content of the present application.

A particularly preferred type of design of the present invention consists in the double exposure with chromium-free phase masks of the above-described type, use being made, in relation to a first chromium-free phase mask, of a second chromium-free phase mask. The latter is arranged in relation to the first phase mask such that its arrangement of strip-like first and second areas assume an angle, preferably 90°, with respect to the arrangement of strip-like first and second areas of the first phase mask. The exposure can thus be carried out in a single exposure step with the photomasks placed one above the other. Alternatively, a single photomask can also be used, being used in two successive exposure steps and rotated through the aforementioned angle after the first exposure step.

Depending on the use of a positive or a negative resist system, either the exposed or the unexposed areas can be removed in a development step after the exposure steps, so that either a regular cluster arrangement or an equally regular hole arrangement can be obtained in a resist layer. The use of negative resists leads to contact holes, the use of positive resists leads to clusters or dots.

The method according to the invention can then be developed in such a way that, with the aid of the material—in particular photoresist—structures produced, a corresponding arrangement of memory components such as magnetic memory components is produced. Here, first of all a matrix-like arrangement of microscopic photoresist structures is produced according to claim 1 and then, with the aid of the arrangement of photoresist structures, the arrangement of magnetic memory elements is produced. For example, first of all a matrix-like arrangement of depressions can be produced in a resist layer in accordance with the method of the invention, which is then filled with a suitable magnetic material in a deposition process. Following the removal of the resist material surrounding the filled depressions, there remains a regular arrangement of magnetic cluster structures, whose extent is determined by the extent of the depressions produced in the method according to the invention and which can be used as magnetic memory elements.

Other features which are considered as characteristic for the invention are set forth in the appended claims.

Although the invention is illustrated and described herein as embodied in a photomask and its use for lithographic structuring of a photoresist layer and for producing magnetic memory elements, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
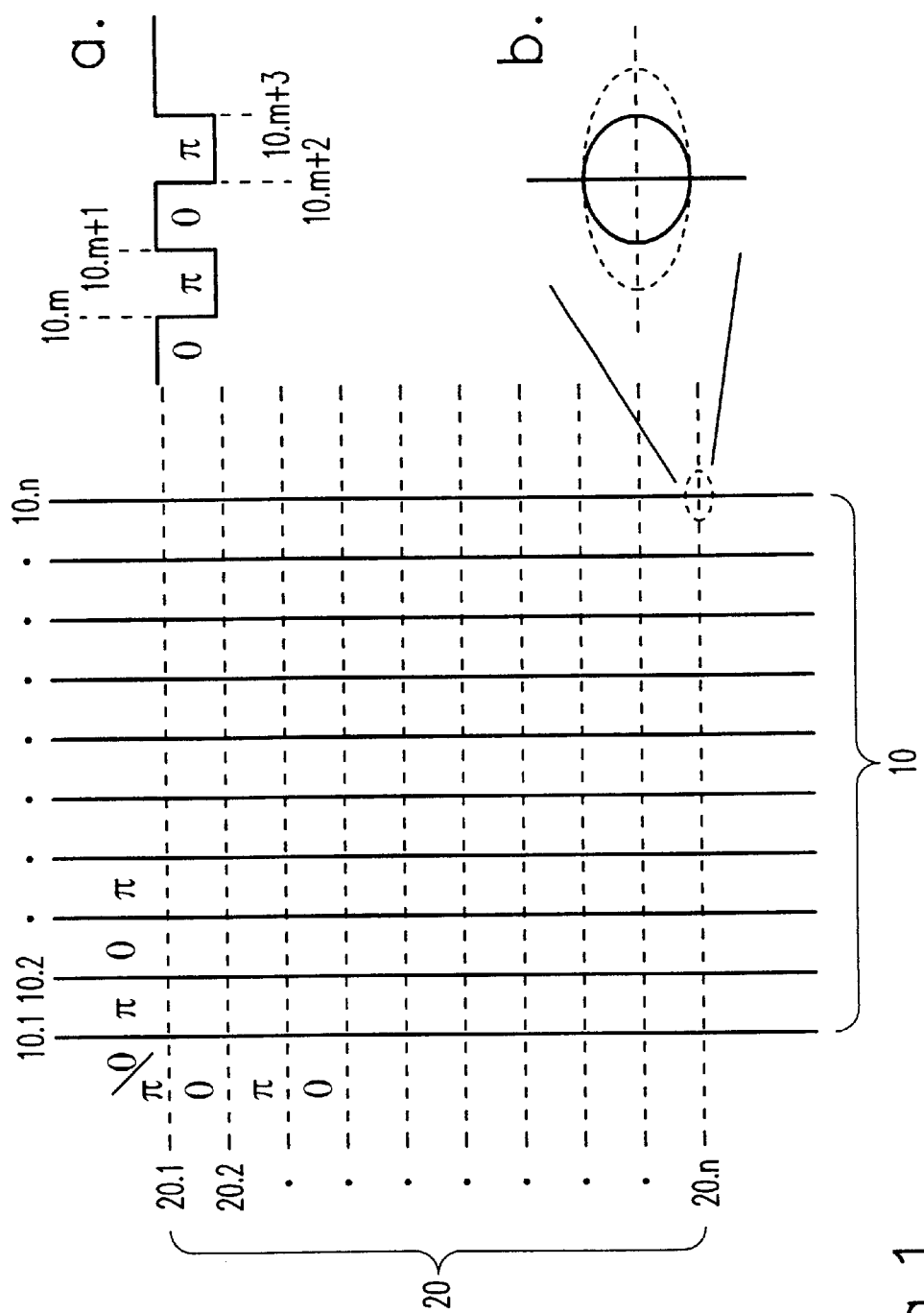
FIG. 1 is a schematic representation of two chromium-free phase masks placed one above the other, their strip-like configurations assuming a 90° angle to each other.

Referring now to the figures of the drawing in detail and first, particularly, to FIG. 1 thereof, the schematic illustration shows two chromium-free phase masks 10 and 20 which, with respect to their strip-like areas, are laid one above the other at a 90° angle. They are exposed in an exposure device such as a wafer stepper, and are projected onto the surface of a material layer to be structured, such as a photoresist layer. In section a. of FIG. 1, a portion of the phase mask 10 is shown schematically along the phase boundary 20.1 of the phase mask 20. This makes it clear that each phase mask has strip-like first areas with a first phase (0) and adjacent strip-like second areas with a second phase (π), which, with respect to the exposure radiation passing through both areas, has a phase difference of 180° relative to the first areas. During the exposure, as a result of destructive interference, unexposed strip-like areas are produced, are located between the first and second areas and are associated with the approximately linear phase boundaries 10.1 . . . 10.n between the first and second areas.

Just such strip-like unexposed areas are produced during exposure with the second phase mask rotated through 90°. In the case of double exposure with the first and second phase mask, the overlap areas between the strip-like unexposed areas of the individual phase masks, formed at the crossing points of the respective phase boundaries, remain as the only unexposed areas. An overlap area of this type is shown in enlarged form in the detail b. of FIG. 1.

In order to give these overlap areas an elliptical shape, as in the detail b., there exist a number of possibilities which, using the structural configuration of FIG. 1 as a basis, were made the subject of simulation calculations.

Figure 2A:
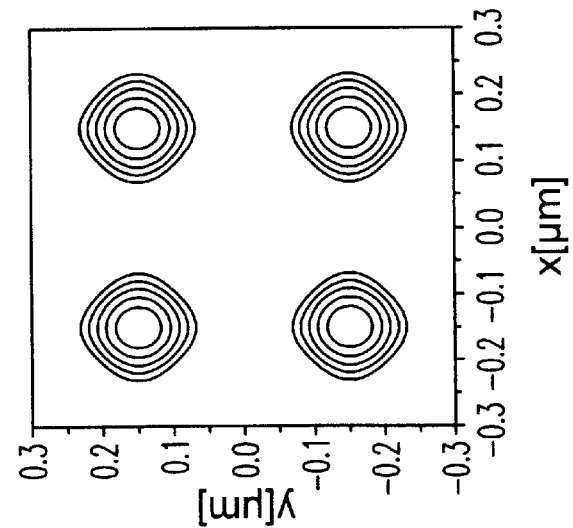
FIGS. 2A–2C, 3A, 3B, 4 and 5 show lightness distributions at individual crossing points on the basis of simulations of the exposure through chromium-free phase masks according to FIG. 1 while varying different parameters.
Figure 2B:
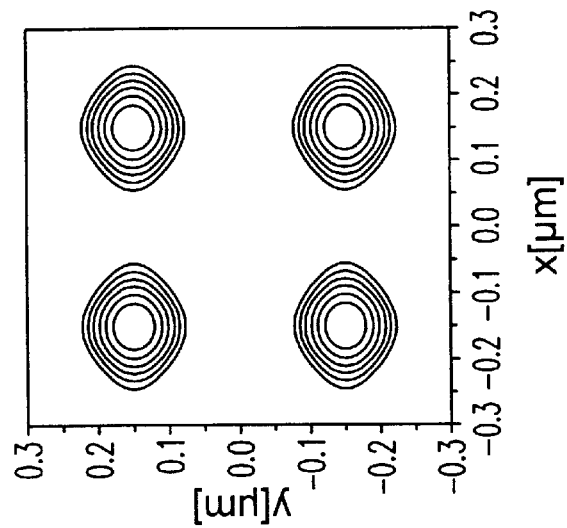
Figure 2C:
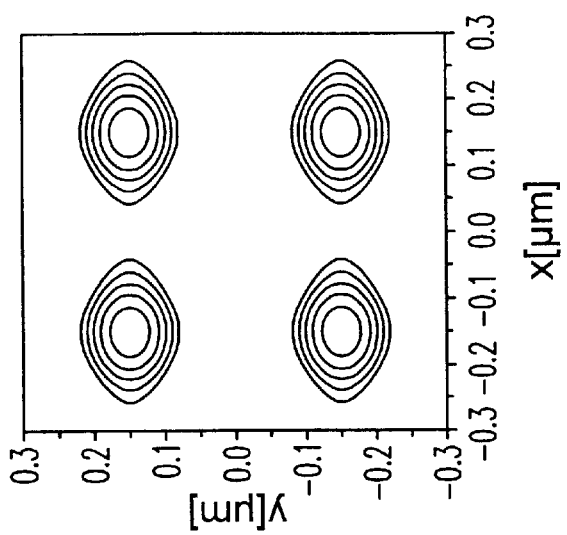

FIGS. 2A–2C each illustrate a detail with four overlap areas at four crossing points of the matrix. The three views show simulation calculations in the form of lines of equal lightness, the relative exposure dose having been changed between the first and the second exposure step. In this case, it has been assumed that a phase mask with identical characteristics was used in the exposure steps. While in FIG. 2A the dose ratio was still 1:1, in FIGS. 2B and 2C it was changed step by step to 1:1.5 and 1:2. As can be seen, the same dose in the two exposures, as expected, leads to the formation of a circularly symmetrical lightness distribution at the crossing points, while changing the dose permits an increasingly elliptical lightness distribution to be produced.

Figure 3A:
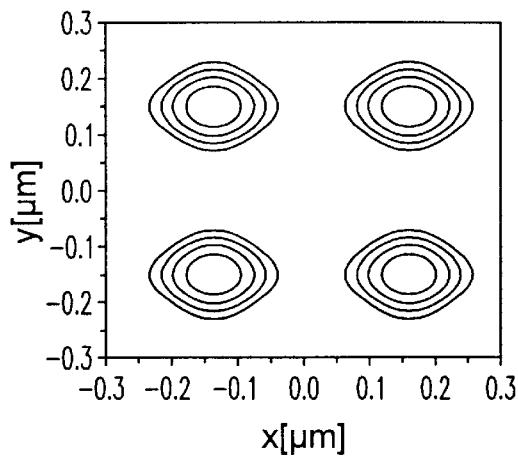
Figure 3B:
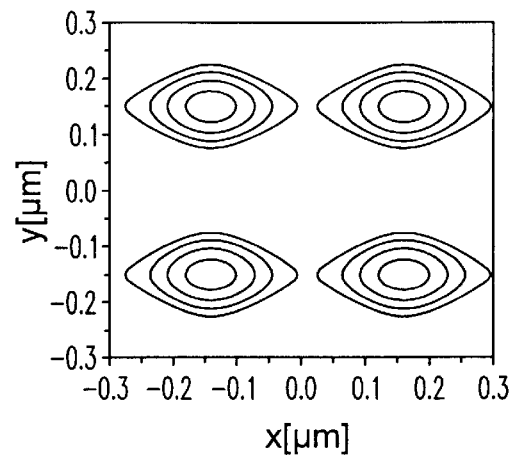

Another method of producing elliptical overlap areas consists in changing the exposure conditions in the exposure device with the same exposure dose in the two exposure steps. FIGS. 3A and 3B show, for example, simulation calculations for the configuration of FIG. 1, wherein it has been assumed that the exposures were carried out with a different filling factor. The filling factor is a measure of what percentage of the diameter of the objective opening is filled by the zero-order diffraction of the objective. A filling factor means, for example, that the zero order of diffraction fills about 50% of the diameter. In the case of FIG. 3A, the filling factor of the first exposure was assumed to be 0.5, and that of the second exposure to be 0.6. In the case of FIG. 3B, with an unchanged filling factor for the first exposure, the filling factor of the second exposure was raised to 0.7. Here, too, it can be seen from the lightness distributions that elliptical structures may be produced.

Figure 4:
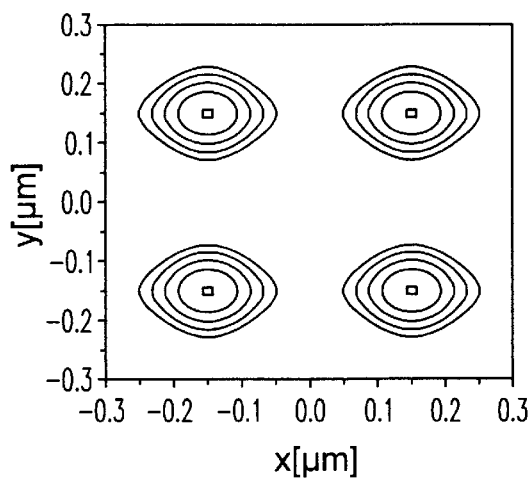

The example shown in FIG. 4 also relates to simulation calculations for the case of changed optical conditions between the individual exposure steps. In this case, the numerical aperture in the first exposure step was chosen to be 0.5, and 0.6 in the second exposure step. The simulation calculations also clearly show for this the formation of elliptical lightness distributions around the crossing points.

Figure 5:
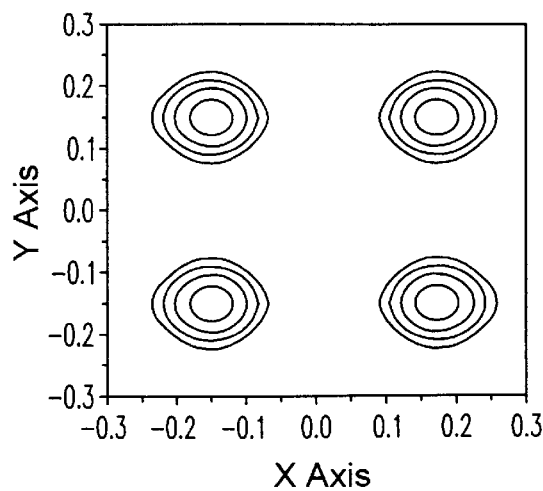

The lightness distribution shown in FIG. 5, finally, was obtained from a simulation calculation wherein phase steps are present at the phase boundaries between the 0-phase shifting and π-phase shifting regions. In this case, an oblique course of the phase jump is introduced on one of the phase masks used during a double exposure. In fabrication terms, this phase course on the mask reticle can be implemented by means of one or more phase steps (for example 180°, 120°, 60°). In the example shown in FIG. 5, one phase mask had a 75 nm wide phase edge with 120° phase shift at the phase boundary and a 75 nm wide phase edge with 60° phase shift. As can be seen, an elliptical structure can also be produced in this way.

We claim:

1. A method of producing a matrix configuration of magnetic memory elements, which comprises:

producing a matrix configuration of microscopic elliptically shaped photoresist structures by exposing a photoresist layer through a photomask where the photomask includes a configuration of at least partially transparent strip-shaped areas disposed immediately adjacent and parallel to one another, the strip-shaped areas including first areas and second areas disposed in an alternating sequence, the first areas having a phase shift of substantially 0° and the second areas having a phase shift of 180° for rays of light passing through;

performing two exposures and rotating an alignment of the strip-shaped areas of the photomask through a given angle between the exposures; and selecting at least one of the following process steps:
carrying out the exposures with different exposure doses; and
carrying out the exposures with a different filling factor σ; and
causing a projection error selected from the group consisting of coma and astigmatism during at least one exposure; and subsequently producing the matrix confirguration of magnetic memory elements with the configuration of microscopic photoresist structures.

2. The method according to claim 1, which comprises providing a material layer and exposing the material layer through the photomask.

3. The method according to claim 2, wherein the material layer is a photoresist layer.

4. The method according to claim 2, wherein the rotating step comprises rotating the strip-shaped areas through 90°.

5. The method according to claim 2, which comprises exposing the material layer through at least two photomasks, and utilizing the two photomasks thereby:

producing a matrix configuration of microscopic elliptically shaped photoresist structures by exposing a photoresist layer through two photomasks where a first photomask and a second photomask include a configuration of at least partially transparent strip-shaped areas disposed immediately adjacent and parallel to one another, the strip-shaped areas including first areas and second areas disposed in an alternating sequence, the first areas having a phase shift of substantially 0° and the second areas having a phase shift of 180° for rays of light passing through;

performing two exposures and rotating an alignment of the strip-shaped areas of the second photomask through a given angle between the exposures; and selecting at least one of the following process steps:
carrying out the exposures with different exposure doses; and
carrying out the exposures with a different filling factor σ; and causing a projection error selected from the group consisting of coma and astigmatism during at least one exposure; and subsequently producing the matrix configuration of magnetic memory elements with the configuration of microscopic photoresist structures.

6. The method according to claim 5, which comprises exposing the material layer through mutually different photomasks.

7. The method according to claim 5, which comprises configuring all of the photomasks according to claim 1.

8. The method according to claim 5, which comprises configuring at least one photomask as a binary photomask having transparent and opaque areas.

9. The method according to claim 2, which comprises selecting photoresist structures from the group consisting of clusters and dots.

10. The method according to claim 2, wherein photoresist structures are cutouts in a material layer.

* * * * *